(12) United States Patent
Zhang et al.

(10) Patent No.: US 10,727,125 B2
(45) Date of Patent: Jul. 28, 2020

(54) BONDING STRUCTURE, FLEXIBLE SCREEN WITH THE BONDING STRUCTURE AND MANUFACTURING METHOD OF THE SAME

(71) Applicant: Kunshan New Flat Panel Display Technology Center Co., Ltd., Jiangsu (CN)

(72) Inventors: Xiuyu Zhang, Jiangsu (CN); Baoyou Wang, Jiangsu (CN); Pengle Dang, Jiangsu (CN); Liwei Ding, Jiangsu (CN); Xiaobao Zhang, Jiangsu (CN); Hui Zhu, Jiangsu (CN)

(73) Assignee: Kunshan New Flat Panel Display Technology Center Co., Ltd., Jiangsu (CN)

( * ) Notice: Subject to any disclaimer, the term of this patent is extended or adjusted under 35 U.S.C. 154(b) by 0 days.

(21) Appl. No.: 16/062,535

(22) PCT Filed: Nov. 30, 2016

(86) PCT No.: PCT/CN2016/108072
§ 371 (c)(1),
(2) Date: Jun. 14, 2018

(87) PCT Pub. No.: WO2017/128855
PCT Pub. Date: Aug. 3, 2017

(65) Prior Publication Data
US 2019/0080962 A1     Mar. 14, 2019

(30) Foreign Application Priority Data
Jan. 26, 2016   (CN) .......................... 2016 1 0052071

(51) Int. Cl.
*H01L 21/77*     (2017.01)
*H01L 23/31*     (2006.01)
(Continued)

(52) U.S. Cl.
CPC .......... *H01L 21/77* (2013.01); *G02F 1/13454* (2013.01); *G02F 1/133305* (2013.01);
(Continued)

(58) Field of Classification Search
None
See application file for complete search history.

(56) References Cited

U.S. PATENT DOCUMENTS

2005/0206016 A1* 9/2005 Shohji ................... H01L 21/563
257/787
2008/0013030 A1    1/2008 Fujita
(Continued)

FOREIGN PATENT DOCUMENTS

CN       202153541 U      2/2012
CN       102889487 A      1/2013
(Continued)

*Primary Examiner* — Walter H Swanson
*Assistant Examiner* — Kien C Ly
(74) *Attorney, Agent, or Firm* — BakerHostetler

(57) ABSTRACT

A bonding structure for a flexible screen and a manufacturing method are provided a flexible screen and a chip mounted on a surface of the flexible screen are arranged on the bonding structure for the flexible screen, and a bonding area for bonding the chip is arranged on the flexible screen, and a flexible protective layer is coated in the bonding area, and the flexible protective layer surrounds around the chip. Compared with the prior art, by forming the flexible protective layer with different hardness around the chip, the stress generated around the chip during the peeling-off are greatly dispersed, a stress gradient is formed, the stress concentration at the position closely adjacent to the periphery of the chip is avoided, the risk of the circuits around the chip being pulled broken can be reduced, and the peeling-off yield of the flexible screen can be finally increased.

10 Claims, 3 Drawing Sheets

(51) Int. Cl.
*H01L 27/12* (2006.01)
*G09F 9/30* (2006.01)
*G02F 1/1345* (2006.01)
*G02F 1/1333* (2006.01)

(52) U.S. Cl.
CPC .......... *G09F 9/301* (2013.01); *H01L 23/3135* (2013.01); *H01L 27/12* (2013.01); *G02F 2201/50* (2013.01); *G02F 2202/023* (2013.01)

(56) References Cited

U.S. PATENT DOCUMENTS

| | | | |
|---|---|---|---|
| 2010/0107304 A1* | 5/2010 | Matsunobu | A41D 19/01547 2/167 |
| 2011/0204497 A1* | 8/2011 | Matsuda | H01L 21/563 257/669 |
| 2011/0235160 A1 | 9/2011 | Hsieh et al. | |
| 2011/0267320 A1 | 11/2011 | Hu | |
| 2015/0348863 A1* | 12/2015 | Du | H01L 23/3128 257/737 |
| 2016/0210894 A1* | 7/2016 | Lee | H05K 1/028 |

FOREIGN PATENT DOCUMENTS

| | | |
|---|---|---|
| CN | 203748111 U | 7/2014 |
| JP | 10-199936 A | 7/1998 |
| JP | 2000-67200 A | 3/2000 |
| JP | 2004356143 A | 12/2004 |
| JP | 2006-237466 A | 9/2006 |
| JP | 2014165441 A | 9/2014 |
| KR | 20130024097 A | 3/2013 |
| TW | 201133431 A | 10/2011 |
| TW | 201137814 A | 11/2011 |

\* cited by examiner

BONDING STRUCTURE, FLEXIBLE SCREEN WITH THE BONDING STRUCTURE AND MANUFACTURING METHOD OF THE SAME

CROSS REFERENCE

This application is a National Stage of International patent application PCT/CN2016/108072, filed on Nov. 30, 2016, which claims priority to foreign Chinese patent application No. 201610052071.5, filed on Jan. 26, 2016, the disclosures of which are incorporated by reference in their entirety.

FIELD OF THE INVENTION

The disclosure relates to the technical field of display screen, and in particular to a bonding structure for a flexible screen and a manufacturing method of the same.

BACKGROUND

In the field of manufacturing a flexible display screen, a flexible screen is quite easily damaged in the manufacturing process due to its own relatively fragile material, therefore in practice, it is usually necessary to attach the flexible screen to a substrate (such as tempered glass) and then perform circuit etching, bonding and other steps, and finally separate the flexible screen from the substrate in a manner of peeling-off. Taking the bonding as an example, elements such as a chip are usually boned in a bonding area on the flexible screen, and a large number of circuits are often distributed around the chip. Therefore, an operation of peeling-off the flexible screen and the substrate must be performed carefully, otherwise a product defective may be caused due to an extremely easy damage of the circuits.

In the prior art, a substrate A is located under the flexible screen, and since there is an obvious hardness difference between the chip B and the flexible screen C itself in the bonding area, relatively large stress will be generated in the bonding area during the actual peeling-off (as shown in FIG. 1), thus stress concentration is formed at a position where the chip B is located at (the area indicated by position D is a stress concentration area), in this way the circuits at this position are easily pulled broken, thereby greatly reducing the peeling-off yield after bonding the flexible screen.

SUMMARY OF THE INVENTION

The embodiments of the disclosure provide a bonding structure for a flexible screen, a flexible screen with the bonding structure and a manufacturing method of the same, which aim to improve a technical problem in the prior art which is low peeling-off yield of a bonding area in the flexible screen.

In order to solve the technical problem mentioned above, the disclosure provides a bonding structure for a flexible screen, including a bonding area and a chip mounted in the bonding area, and a flexible protective layer is arranged in the bonding area and the flexible protective layer surrounds around the chip.

Further, the flexible protective layer comprises a first protective layer arranged around the chip and a second protective layer arranged at the periphery of the first protective layer.

Further, the first protective layer is a UV adhesive layer coated around the chip, and the second protective layer is a silica gel layer coated at the periphery of the first protective layer.

Further, the first protective layer is a polyimide adhesive layer coated around the chip, and the second protective layer is a UV adhesive layer coated at the periphery of the first protective layer.

Further, an inner side of the first protective layer is attached around the chip, the second protective layer is joined at the periphery of the first protective layer, and the second protective layer has a thickness smaller than a thickness of the first protective layer.

Further, the thickness of the flexible protective layer is gradually increased in a direction toward the chip.

The disclosure also provides a manufacturing method of a bonding structure for a flexible screen, the manufacturing method includes:

setting a bonding area on a surface of the flexible screen, and bonding a chip in the bonding area; and arranging a flexible protective layer around the chip.

Further, said arranging a flexible protective layer around the chip comprises: arranging a first protective layer around the chip so that the first protective layer is respectively connected to the chip and the flexible screen; and arranging a second protective layer at the periphery of the first protective layer, the second protective layer having a thickness smaller than a thickness of the first protective layer.

Further, said arranging a flexible protective layer around the chip specifically comprises: coating a UV adhesive layer and irradiating the UV adhesive layer with ultraviolet light to make it cure. Said arranging a second protective layer at the periphery of the first protective layer specifically comprises: coating a silica gel layer and distributing the silica gel layer throughout the bonding area located at the periphery of the UV adhesive layer.

Further, said arranging a flexible protective layer around the chip specifically comprises: coating an adhesive layer made of a single material around the chip, and the thickness of the adhesive layer being gradually increased in a direction toward the chip.

The following technical effects can be achieved by employing at least one of the technical solutions of the disclosure: by forming the flexible protective layer with different hardness around the chip, the stress generated around the chip during the peeling-off are greatly dispersed, a stress gradient is formed, the stress concentration at the position closely adjacent to the periphery of the chip is avoided, the risk of the circuits around the chip being pulled broken can be reduced, and the peeling-off yield of the flexible screen can be finally increased.

BRIEF DESCRIPTION OF THE DRAWINGS

The illustrated drawings herein are provided for further understanding of the disclosure and constitute a part of the disclosure. The exemplary embodiments of the disclosure and the descriptions thereof aim to explain the disclosure rather than improperly limit the disclosure. In the drawings.

DETAILED DESCRIPTION

To make objects, technical solutions, and advantages of the disclosure more clear, the technical solutions of the disclosure will be described clearly and completely below in combination with specific embodiments and corresponding accompanying drawings of the disclosure. It is apparent that the described embodiment is only a part of the embodiments of the disclosure, not all the embodiments. On the basis of the embodiments of the disclosure, all other embodiments obtained by a person skilled in the art without paying creative work will fall within the protection scope of the disclosure.

The technical solutions provided by each embodiment of the disclosure are described in detail below in combination with the accompanying drawings.

Embodiment 1

Figure 1:
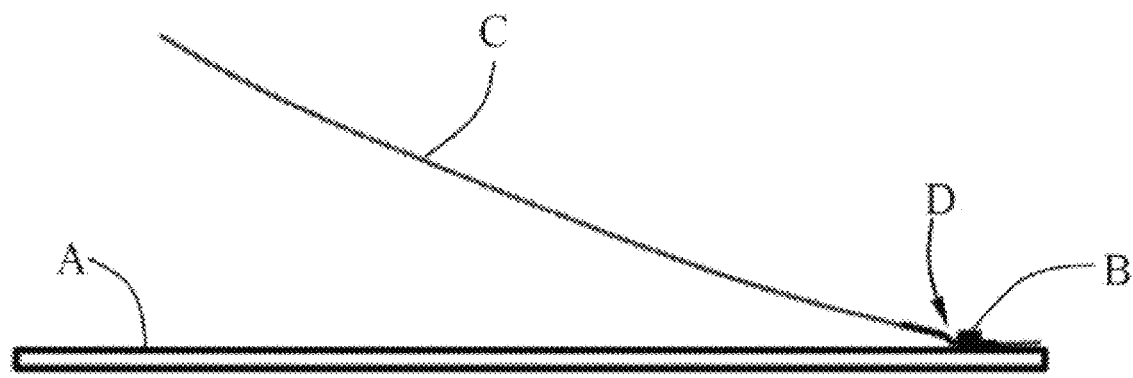
FIG. 1 is a structural schematic view during a flexible screen being peeled from a substrate in the prior art.
Figure 2:
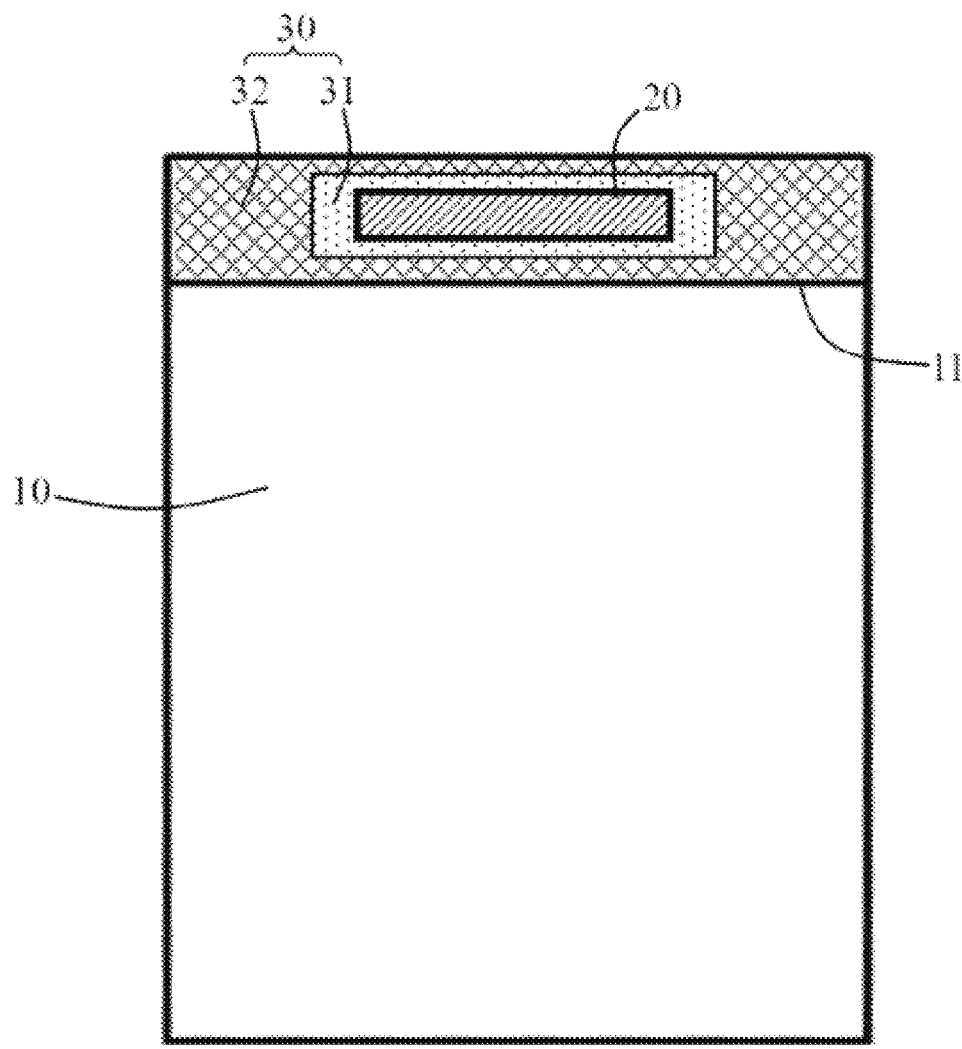
FIG. 2 is a schematic view of a bonding structure for a flexible screen in an embodiment 1 of the disclosure.

In order to solve the problem of low peeling-off yield of an existing flexible screen, the embodiment of the disclosure provides a bonding structure for a flexible screen. With reference to FIG. 2, the flexible screen includes a display area 10, a bonding area 11 connected to the display area 10 and a chip 20 mounted in the bonding area. A flexible protective layer 30 surrounding around the chip 20 is arranged in the bonding area 11, namely the flexible protective layer 30 surrounds around the chip 20 in the horizontal direction. Wherein the flexible protective layer 30 includes a first protective layer 31 arranged around the chip 20 in the horizontal direction and a second protective layer 32 arranged at the periphery of the first protective layer 31 in the horizontal direction. A material for the first protective layer 31 is different from a material for the second protective layer 32, but both of them are flexible materials, and the first protective layer 31 has a thickness greater than that of the second protective layer 32.

Wherein the bonding area 11 is arranged on the flexible screen for bonding the chip 20. In the present embodiment, the bonding area 11 is located on one side of the flexible screen, and the chip 20 is bonded in the bonding area 11 and mounted on the flexible screen. The first protective layer 31 surrounds around the chip 20, and an inner side of the first protective layer 31 is attached at the peripheral edges of the chip 20, so that the peripheral edges of the chip 20 are connected to a surface of the flexible screen by the first protective layer 31. The second protective layer 32 is distributed in the bonding area 11, and covers the peripheral areas of the chip 20, and the second protective layer 32 may cover the first protective area 31, or instead of covering the first protective layer 31, the second protective layer 32 may be coated directly at the periphery of the first protective layer 31 and joined at the periphery of the first protective layer 31. Both ways of which can improve the strength of the bonding area 11 and relieve the stress concentration caused during the peeling-off, which can be selected according to practical requirements. By arranging the first protective layer 31 and the second protective layer 32 with different materials, a double adhesive layer structure with gradually changing hardness is formed around the chip 20, thus a stress gradient can be formed, so that the stress around the chip 20 is gradually increased in a direction gradually approaching the chip 20, thereby achieving the purpose of dispersing stress and avoiding stress concentration.

In the present embodiment, preferably, the first protective layer 31 may be employed UV (Ultraviolet Rays) adhesive, which is also referred to as ultraviolet light curing adhesive, and the second protective layer 32 may be employed silica gel. The silica gel is coated and joined at the periphery of the UV adhesive, and the silica gel is coated throughout the bonding area 11 located at the periphery of the UV adhesive.

Embodiment 2

Figure 3:
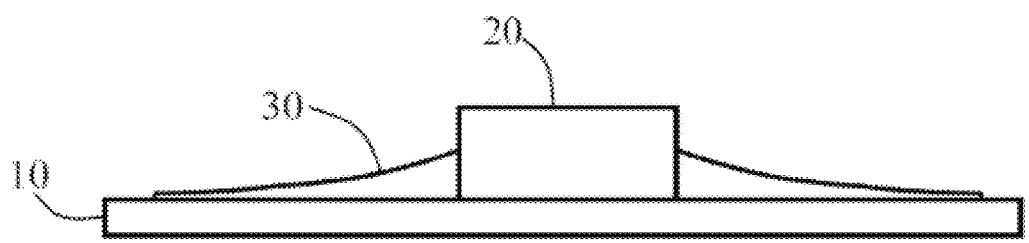
FIG. 3 is a schematic view of a bonding structure for a flexible screen in an embodiment 2 of the disclosure.

The embodiment of the present disclosure provides a flexible screen bonding structure. The embodiment of the present disclosure provides a bonding structure for a flexible screen. With reference to FIG. 2, the flexible screen includes a display area 10, a bonding area 11 connected to the display area 10 and a chip 20 mounted in the bonding area. A flexible protective layer 30 surrounding around the chip 20 is arranged in the bonding area 11, and the flexible protective layer 30 is an adhesive layer made of a single material, which is coated in the bonding area 11 of the flexible screen. The thickness of the flexible protective layer 30 is gradually increased in a direction toward the chip 20, as shown in FIG. 3, that is, the thickness of the flexible protective layer 30 at the edges of the bonding area 11 is smaller than the thickness of which at the peripheral edges of the chip 20, as such the flexible protective layer 30 with a gradually changing thickness can form a structure with gradually changing hardness around the chip 20, thereby forming a stress gradient, and achieving the purpose of dispersing stress and avoiding stress concentration. The protective layer of the present embodiment is an adhesive layer made of a single material, and a stress gradient can be formed by controlling the thickness of the protective layer. Thus the process flow can be decreased and manufacturing difficulty can be reduced.

Embodiment 3

The embodiment of the present disclosure provides a manufacturing method of a bonding structure for a flexible screen, which includes the following steps:

S01: setting a bonding area on the surface of the flexible screen and bonding a chip in the bonding area; and S02: arranging a flexible protective layer around the chip.

Wherein in S02, said "arranging a flexible protective layer around the chip" includes: arranging a first protective layer around the chip, so that the first protective layer is respectively connected to the chip and the surface of the flexible screen; and arranging a second protective layer at the periphery of the first protective layer, and the thickness of the second protective layer is smaller than the thickness of the first protective layer.

Preferably, said "arranging a first protective layer" refers to coating a UV adhesive layer and irradiating the UV adhesive layer with ultraviolet light to make it cure. Said "arranging a second protective layer" refers to coating a silica gel layer, distributing the silica gel layer throughout the bonding area located at the periphery of the first protective layer and connecting the silica gel layer to the UV adhesive layer. Certainly, the materials for the first protective layer and the second protective layer may also be employed other flexible materials. For example, said "arranging a first protective layer" may also refer to coating a polyimide adhesive layer, and said "arranging a second protective layer" may also refer to coating a UV adhesive layer, which can also disperse the stress around the chip, the description of which will be omitted here.

Certainly, in the embodiment of the present disclosure, "arranging a flexible protective layer around the chip" in S02 may also be performed in other ways, which may include: coating an adhesive layer made of a single material with gradually changing thickness at the periphery of the chip, and the thickness of the adhesive layer being gradually increased in the direction toward the chip. With reference to FIG. 3, as such a structure with gradually changing hardness is formed, so that a stress gradient can be formed, and the purpose of dispersing stress and avoiding stress concentration can be achieved.

Figure 4:
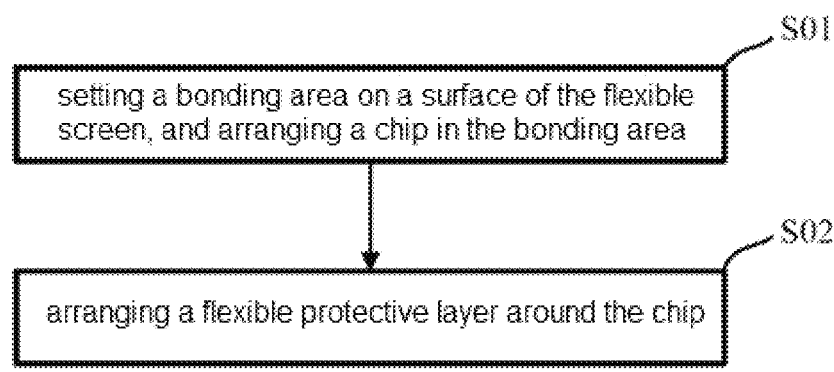
FIG. 4 is a flow chart of a manufacturing method of a bonding structure for a flexible screen in an embodiment 3 of the disclosure.
Figure 5:
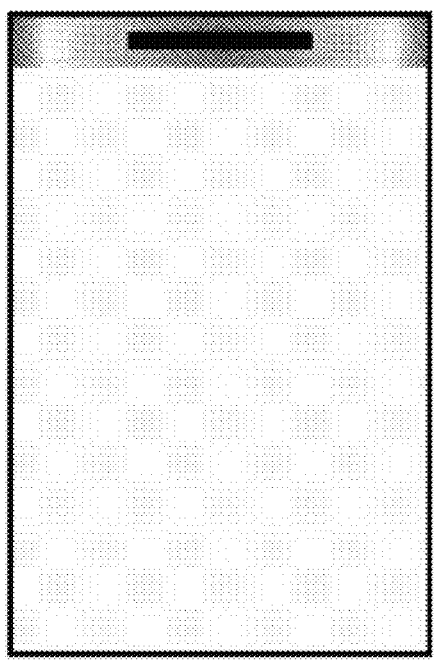
FIG. 5 is a hardness distribution view of the bonding structure for the flexible screen in the embodiment 3 of the disclosure.

It is shown experimentally that, by employing the bonding structure for the flexible screen and the manufacturing method of the same provided by the embodiments 1, 2 and 3 of the present disclosure, the flexible protective layer 30 (such as the first protective layer 31 and the second protective layer 32) with gradually changing hardness can be formed around the chip in the bonding area 11. As shown in FIGS. 3-5, the stress within the bonding area 11 forms a stress gradient from its periphery to its center by the flexible protective layer 30. That is, the stress at the edge of the bonding area 11 is minimum (which is because Moh's hardness is the smallest here), and the stress is gradually increased in the direction toward the chip (which is because Moh's hardness is gradually increased), so that the stress around the chip 20 can be greatly dispersed, and the stress concentration created at the position closely adjacent to the periphery of the chip 20 during the peeling-off is avoided, thereby reducing the risk of the circuits around the chip being pulled broken, and finally increasing the peeling-off yield of the flexible screen.

The above description is only the exemplary embodiments of the present disclosure and is not intended to limit the present disclosure. It will be apparent to a person skilled in the art that various modifications and variations can be made to the present disclosure. Any modification, equivalent replacement, and improvement made within the spirit and principle of the present disclosure shall fall within the scope of the claims of the present disclosure.

What is claimed is:

1. A bonding structure for a flexible screen, comprising a bonding area and a chip mounted in the bonding area,
    wherein a flexible protective layer is arranged in the bonding area,
    wherein the flexible protective layer surrounds the chip,
    wherein Moh's hardness of the flexible protective layer is increased in a direction toward the chip,
    wherein the flexible protective layer comprises a first protective layer arranged around the chip and a second protective layer arranged at a periphery of the first protective layer, and
    wherein Moh's hardness of the first protective layer is greater than Moh's hardness of the second protective layer.

2. The bonding structure for the flexible screen according to claim 1, wherein the first protective layer is a UV adhesive layer, and
    wherein the second protective layer is a silica gel layer.

3. The bonding structure for the flexible screen according to claim 1, wherein the first protective layer is a polyimide adhesive layer, and
    wherein the second protective layer is a UV adhesive layer.

4. A flexible screen, comprising the bonding structure according to claim 1.

5. The bonding structure for the flexible screen according to claim 1, wherein the flexible protective layer is an adhesive layer made of a single material, and
    wherein a thickness of the adhesive layer is increased in the direction toward the chip.

6. The bonding structure for the flexible screen according to claim 1, wherein the first protective layer is not disposed throughout the bonding area, and
    wherein the second protective layer covers the first protective layer and is disposed throughout the bonding area.

7. The bonding structure for the flexible screen according to claim 6, wherein the first protective layer is a UV adhesive layer, and
    wherein the second protective layer is a silica gel layer.

8. The bonding structure for the flexible screen according to claim 6, wherein the first protective layer is a polyimide adhesive layer, and
    wherein the second protective layer is a UV adhesive layer.

9. The bonding structure for the flexible screen according to claim 1,
    wherein the first protective layer is lower than the chip.

10. The bonding structure for the flexible screen according to claim 1, wherein the flexible protective layer comprises four regions, and
    wherein Moh's hardness of the four regions respectively become 2, 4, 7, and 9, along the direction toward the chip.

* * * * *